United States Patent [19]

Lwee

[11] Patent Number: 5,324,204
[45] Date of Patent: Jun. 28, 1994

[54] CONNECTOR DEVICE

[76] Inventor: Nai Hock Lwee, Block 341, Bukit Batok Street 34, #08 50, Singapore, Singapore, 2365

[21] Appl. No.: 943,092
[22] Filed: Sep. 10, 1992

[30] Foreign Application Priority Data

Sep. 12, 1991 [JP] Japan .................................. 3-261197

[51] Int. Cl.⁵ ............................................... H05K 7/10
[52] U.S. Cl. ..................................... 439/64; 361/684; 439/159
[58] Field of Search ............. 439/64, 79, 80, 152–160, 439/377, 540, 166, 170, 172; 361/380, 392–395, 684

[56] References Cited

U.S. PATENT DOCUMENTS

| | | | |
|---|---|---|---|
| 4,918,572 | 4/1990 | Tarver | 439/377 |
| 4,952,161 | 8/1990 | Komatsu | 439/155 |
| 5,033,972 | 7/1991 | Komatsu | 439/377 |
| 5,149,276 | 9/1992 | Dixon | 439/159 |
| 5,152,697 | 10/1992 | Abe | 439/152 |
| 5,176,523 | 1/1993 | Lai | 439/64 |
| 5,197,894 | 3/1993 | Koike | 439/159 |

Primary Examiner—Neil Abrams
Attorney, Agent, or Firm—Woodcock Washburn Kurtz Mackiewicz & Norris

[57] ABSTRACT

A connector device comprises a housing having an internal storage space for inserting one or more storage devices therein. A shallow guide member is coupled along one of the inner side walls of the housing to define upper and lower storage spaces within the housing without substantially interrupting the overall storage space of the housing. A connector section coupled to one end of the housing has upper and lower contact arrays disposed respectively in the upper and lower storage spaces. At least one of the contact arrays is adapted to interchangeably connect to either a memory card or a hard disk drive package. A single hard disk drive package may be connected to the connect device, thereby occupying the entire storage space of the house, or alternatively, a memory card may be inserted into each of the upper and lower storage spaces. The connector device may further comprise upper and lower ejection mechanisms for ejecting storage devices from the respective storage spaces.

20 Claims, 6 Drawing Sheets

CONNECTOR DEVICE

BACKGROUND OF THE INVENTION

1. Field of the Invention

The present invention relates to a connector device which can be used for both a memory card and a hard disk drive package serving as a data storage device to be connected to a personal computer, a laptop computer or a Notebook-PC.

2. Description of the Related Art

The recent development in personal computers has created what has become known as the laptop computer which is substantially portable and consumes little power. A further advancement on the laptop computer is the so-called Notebook-PC.

As the size reduction of the computer device such the personal computer, the laptop computer or the Notebook-PC is promoted, demand has arisen for increasing its data storage capacity at low cost. To increase the processing speed of stored data and to increase the capacity, it is preferable to use a memory card or a hard disk as a data storage medium rather than a floppy disk.

The memory card is advantageous as it is detachably mounted in a computer device and is portable.

Although a low-profile, portable hard disk drive (HDD) package incorporating a hard disk is available, it is comparatively expensive. Accordingly, when an HDD package is integrally assembled in each individual computer device, the cost of the computer device is increased.

Furthermore, if the computer device incorporates the HDD package, even a third person can start the operating system. Therefore, data stored in the hard disk can be illegally used or misused.

For these reasons, it is demanded that an HDD package is detachably connected to a computer device in the same manner as a memory card, so that the single HDD package can be compatible used with a plurality of computer devices, and separated from the computer device and stored or carried. To detachably connect the HDD package to the computer device is preferable to allow an end user with a wide choice of the operating system, as specifications of hard disks differ from each other depending on operating systems.

SUMMARY OF THE INVENTION

It is an object of the present invention to provide a connector device which can be used for both a memory card and an HDD package and which can be detachably mounted or connected, thereby satisfying the demands described above.

The present invention has achieved the above object by a connector device comprising: a housing having an insertion port at one end of a length of the housing and divided storage spaces which are divided in a height of the housing so that the data storage device which is selectively inserted through the insertion port is housed and held therein, the divided storage spaces including one first divided storage space for housing and holding one memory card each therein and one second divided storage space for housing and holding one hard disk drive package each therein; and a connecting member, provided at the other end of the length of the housing to correspond to the first and second divided storage spaces, and having first and second pin terminal arrays, the first pin terminal array being electrically connected to one data storage device housed in a corresponding one of the divided storage spaces, and the second pin terminal array integrally extending from the first pin terminal array adapted to be electrically connected to an external electronic equipment.

Examples of the combinations of the first and second divided storage spaces include a combination in which at least one second divided storage space includes at least one first divided storage space, a combination in which at least one second divided storage space also serves as at least one first divided storage space, a combination in which at least one first divided storage space exists independently of the second divided storage space, and a combination in which at least one second divided storage space exists independently of the first divided storage space.

According to an embodiment of the present invention, the connector device further comprises an engaging member, provided in each of the first and second divided storage spaces, engageable with one information storage device electrically connected to the first pin terminal array of the connecting member in the corresponding one divided storage space, and slidably movable in the direction of the depth of the housing, and an ejecting member, respectively, provided in the first and second divided storage spaces to be capable of operating independently of each other, for slidably moving the engaging member in the corresponding one divided storage space toward the insertion port of the housing, in order to disconnect the first pin terminal array of the connecting member in the corresponding one divided storage space from the one data storage device and to eject the one data storage device outside the housing through the insertion port.

According to the embodiment of the present invention, the connector device further comprises a locking member, in at least one second divided storage space, for releasable locking the hard drive package connected to the first pin terminal array to prevent loose connection between the connecting member of the hard disk drive package received in the second divided storage space and the first pin terminal array.

Examples of the external electronic equipment include a computer device, e.g., a personal computer, a laptop computer, and a notebook type personal computer (Notebook-PC).

According to the connector device of the present invention, since the housing has the first and second divided storage spaces for the memory card and the HDD package, respectively, the memory card and the HDD package can be selectively used as the data storage device.

According to the connector device of the present invention, since a single connector device can be commonly used for both the memory card and the HDD package, the HDD package as well as the memory card can be detachably connected to an electronic equipment such as computer device. Accordingly, an HDD package need not be integrally assembled in a computer device or the like. As a result, the cost is decreased, and an end user can flexibly choose an operating system. Furthermore, since the HDD package can be separated from the computer device and be stored, data stored in the hard disk drive can be reliably protected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
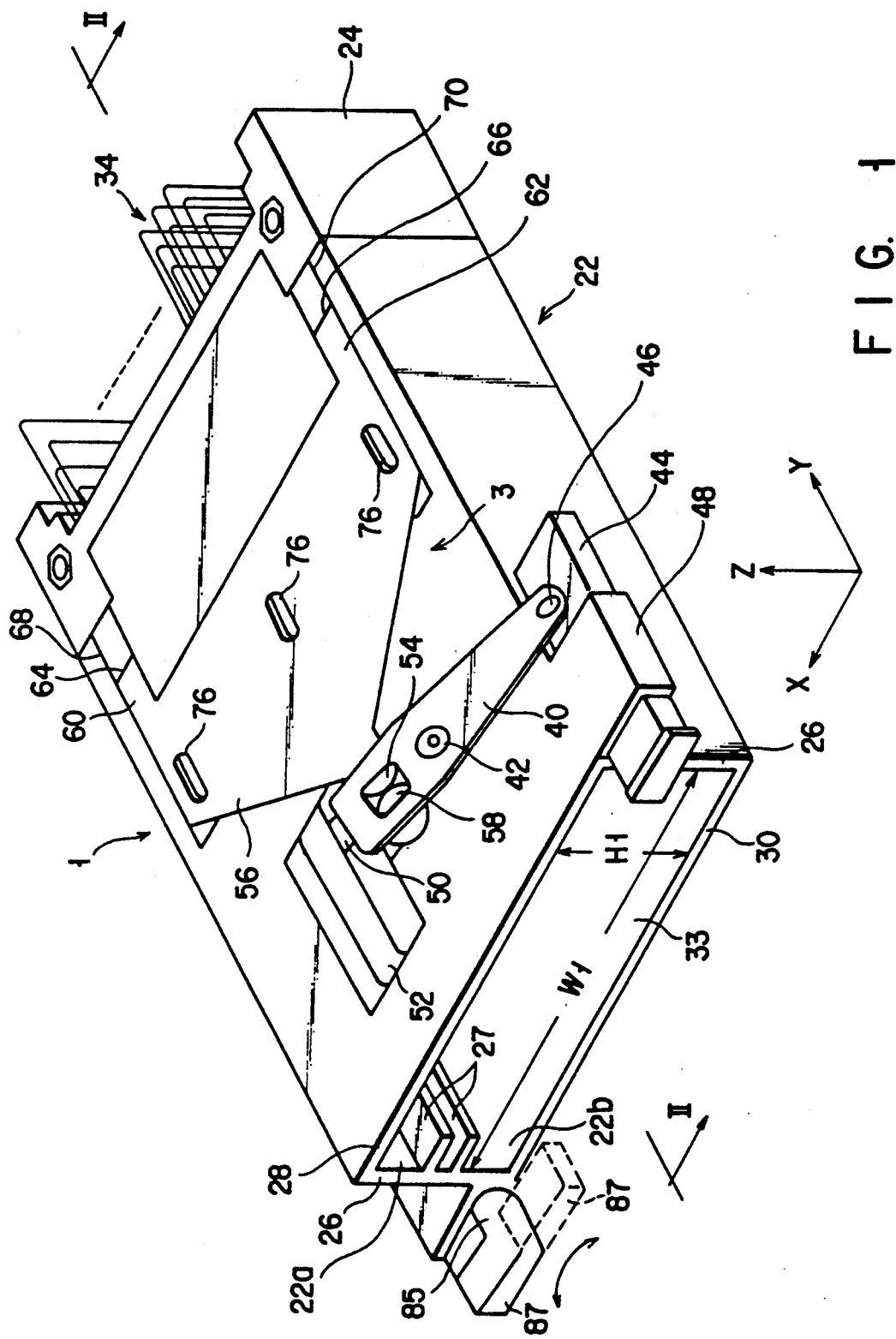
FIG. 1 is a perspective view showing a connector device according to the first embodiment of the present invention.
Figure 2:
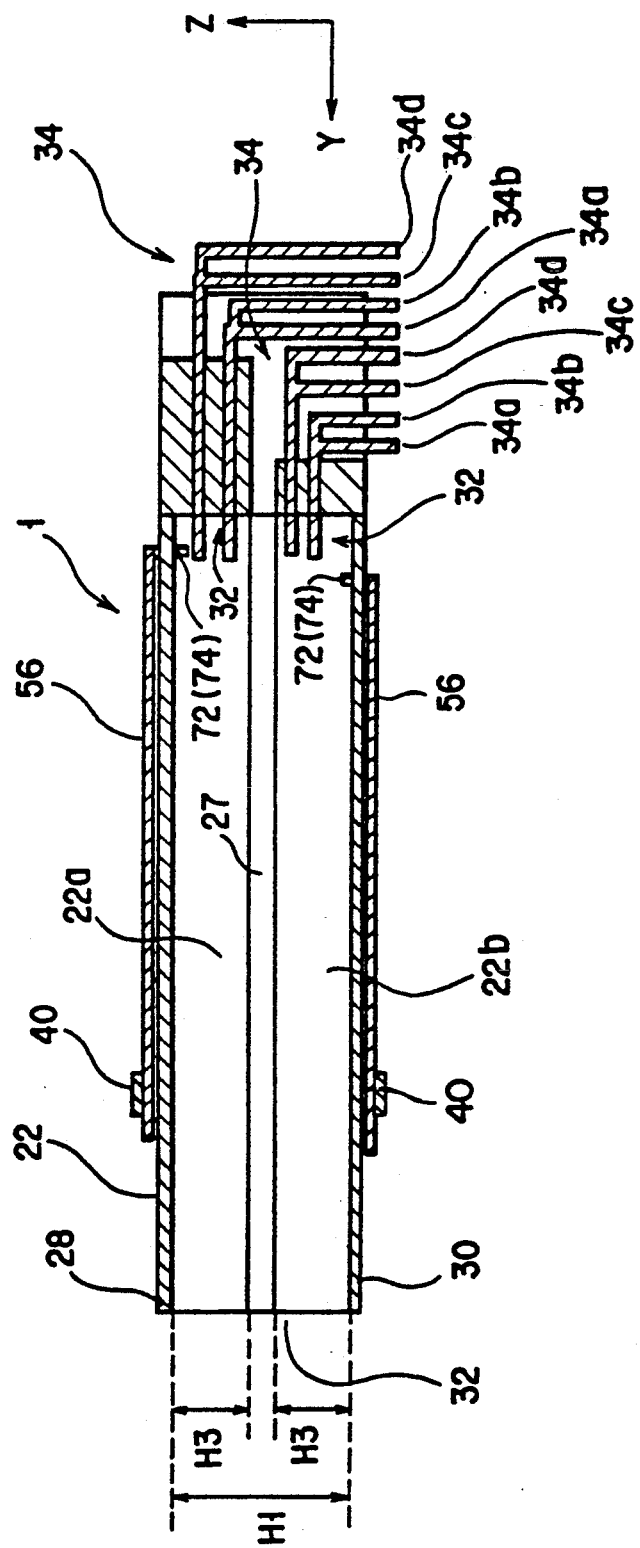
FIG. 2 is a sectional view of the connector device taken along the line II—II of FIG. 1.

FIGS. 1 and 2 show the first embodiment of the present invention. A connector device 1 of this embodiment can selectively receive two memory cards and one HDD package as a data storage device.

This connector device 1 is mounted on a known computer device (not shown) such as a personal computer, a laptop computer, or a Notebook-PC. In figures, the widthwise direction, the direction of the length, and the direction of the height of the connector device 1 and the memory card 2 or the HDD package 4 are set as X, Y, and Z directions, respectively.

Figure 3:
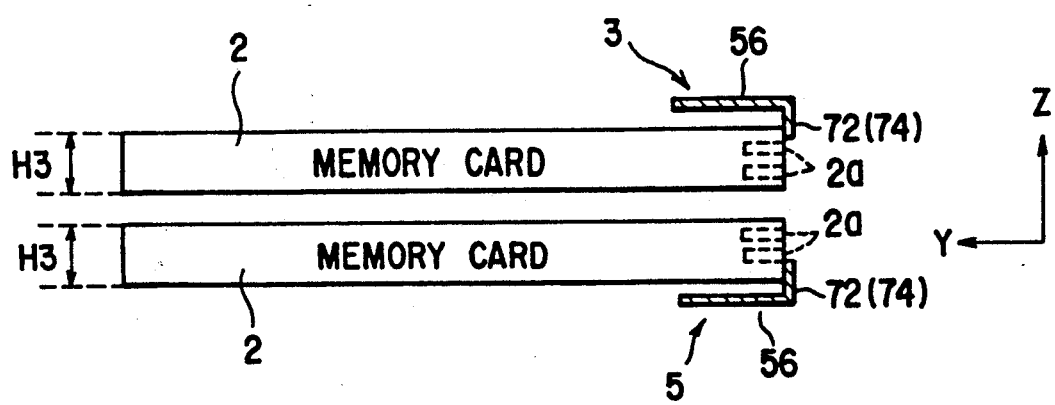
FIG. 3 is a side view showing a memory card mounted in the connector device shown in FIG. 1.

The memory card 2 shown in FIG. 3 is known in the art and essentially consists of a random access memory (RAM) incorporated into a card-like device. This memory card 2 represents a non-volatile RAM, which once it has been loaded with data, can be withdrawn from the connector device 1. Sockets 2a to be fitted on two pin contact arrays 32 (to be described later) of the connector device 1 are formed in the forward end face of the memory card 2.

Figure 4:
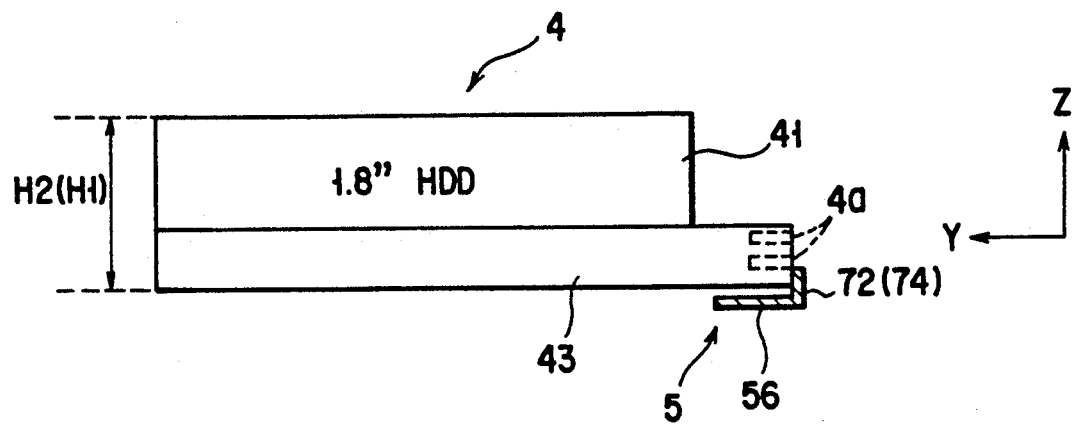
FIG. 4 is a side view showing an HDD package mounted in the connector device shown in FIG. 1.

The HDD package 4 shown in FIG. 4 is a low-profile HDD package comprising, e.g., a low-profile housing 41 receiving a 1.8" disk drive (not shown), and a base plate 43 on which the housing 41 is placed and an HDD drive circuit board (not shown) is mounted. Sockets 4a to be fitted in the lower pin contact array 32 (to be described later) of the connector device 1 are formed in the forward end face of the base plate 43. The width of each of the housing 41 and the base plate 43 is almost equal to that of the memory card 2. The HDD package 4 can be used in a similar manner to that for the member card 2.

A connector section 24 of the connector device 1 is coupled to a housing 22. The housing 22 has a pair of side walls 26 defining its two sides and upper and lower housing plates 28 and 30 defining its upper and lower surfaces.

An insertion port 33 of the housing 22 has a width $W_1$ slightly larger than the width of the memory card 2 or the HDD package 4, and a height $H_1$ almost the same as a package height $H_2$ of the HDD package 4. Accordingly, one HDD package 4 can be received in the storage space in the housing 22.

A guide member 27 is integrally formed on the inner wall of the side wall 26 of the housing 22 along the longitudinal direction of the side wall 26. Upper and lower storage spaces 22a and 22b in the housing 22 which are defined by the guide member 27 can respectively receive memory cards 2. The height of the memory card 2, i.e., the thickness is defined as $H_3$. The card thickness $H_3$ is set such that its thickness, when two cards are stacked, is smaller than the package height $H_2$ of the HDD package 4, i.e., $2 \times H_3 < H_2$.

The two contact pin arrays 32, to be fitted in the sockets formed on the memory card 2 or HDD package 4 side, and four pin contact arrays 34, integrally extending from the pin contact arrays 32 to be connected with the computer device, are arranged in the connector section 24. A set of the pin contact arrays 32 and 24 is arranged to correspond to each of the upper and lower storage spaces 22a and 22b. With this connector device 1, the memory card 2 and the HDD package 4 can be selectively connected to the computer device by mounting the single HDD package 4 in the housing 22 or the memory card 2 in at least one of the upper and lower storage spaces 22a and 22b of the housing 22. Furthermore, according to this embodiment, the housing 22 preferably has upper and lower ejection mechanisms 3 and 5. The ejection mechanisms 3 and 5 will be described.

Figure 5:
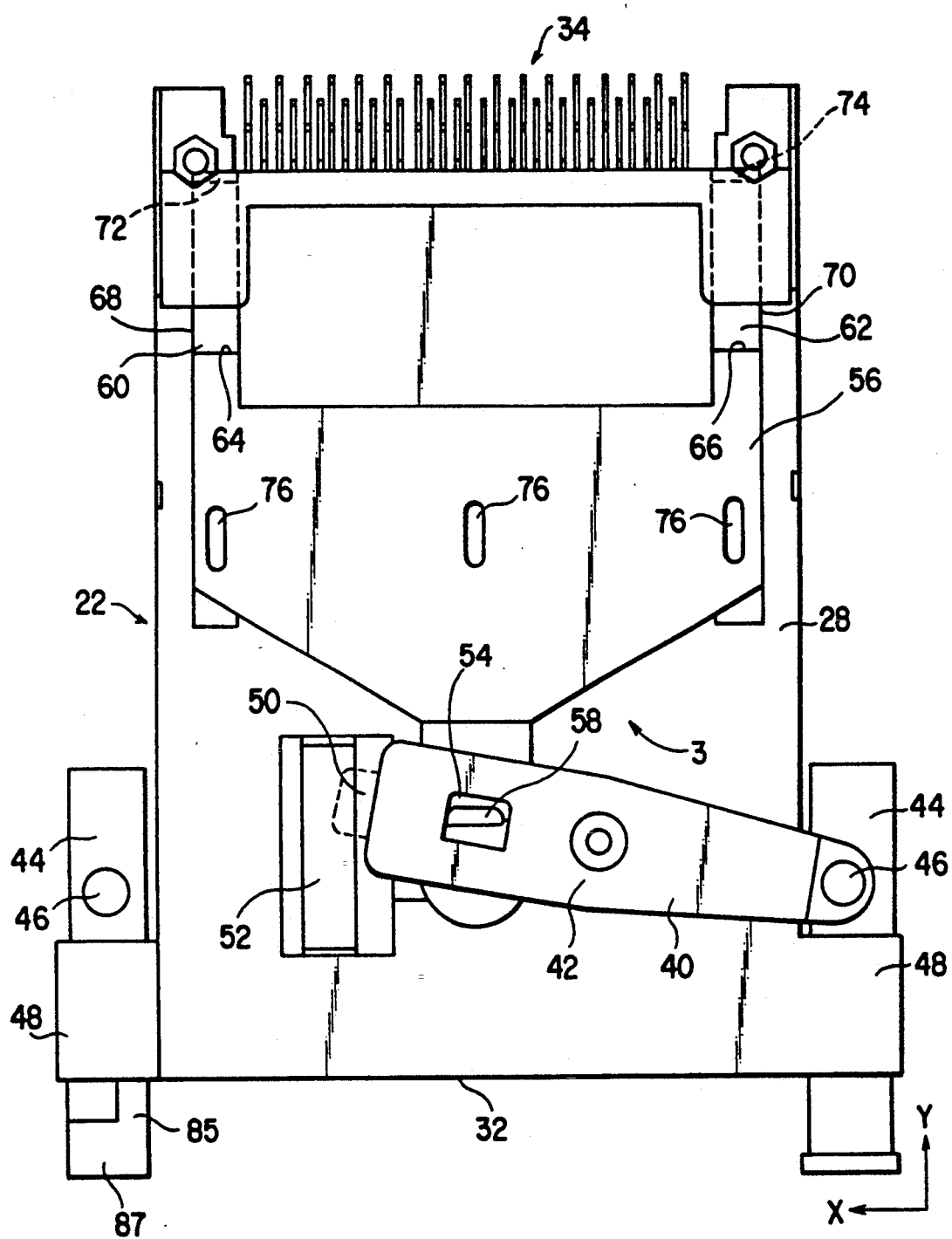
FIG. 5 is a plan of the connector device shown in FIG. 1 seen from the above which shows an ejection mechanism.
Figure 6:
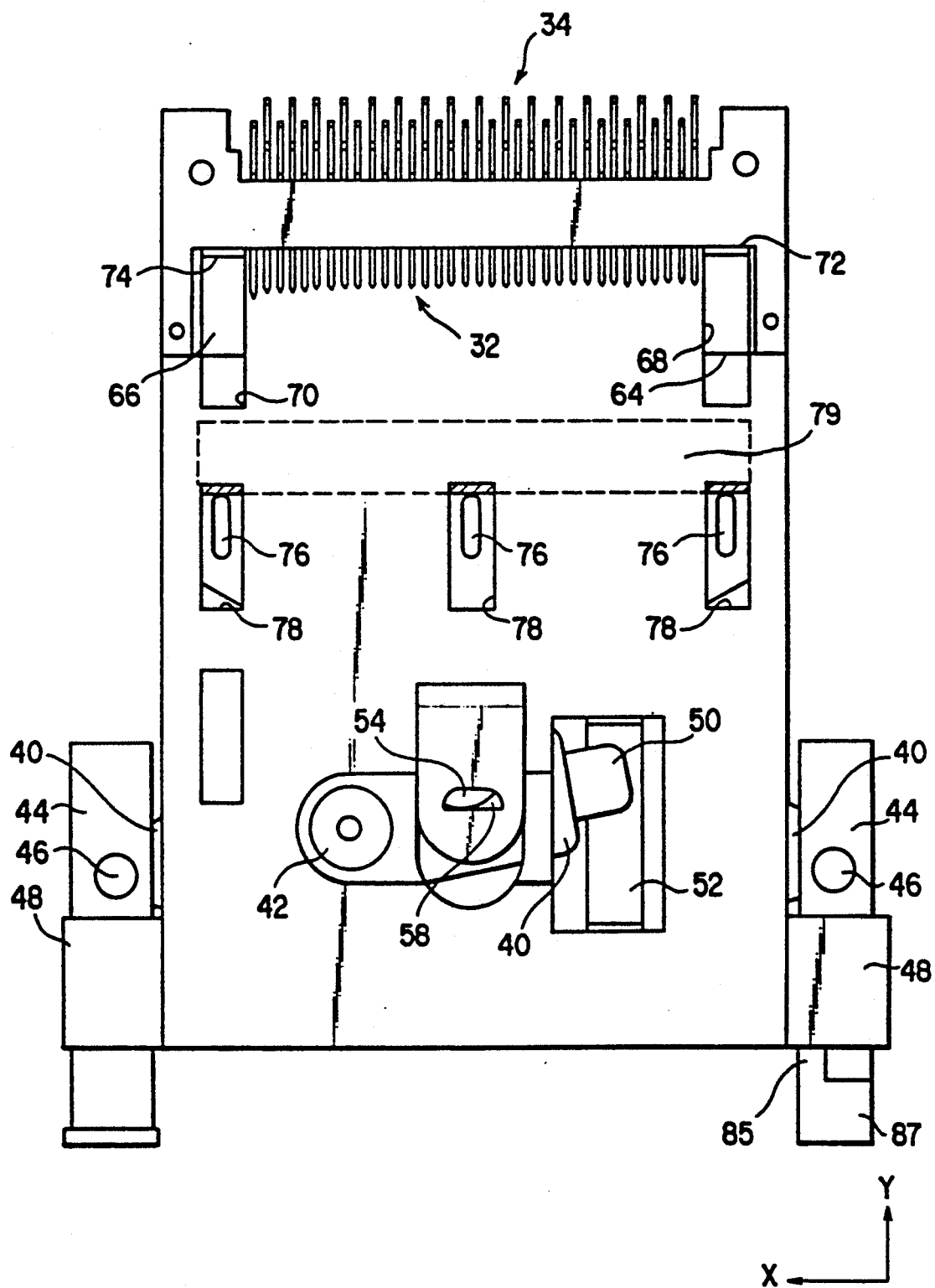
FIG. 6 is a bottom view of the connector device shown in FIG. 1 seen from the bottom which shows the ejection mechanism.

FIGS. 5 and 6 respectively show upper and lower surfaces of the upper housing plate 28 of the connector device 1, and mainly the upper ejection mechanism 3.

In the vicinity of the insertion port 33 of the housing 22, a pivot lever 40 is rotatably supported on the housing plate 28 by a rotation shaft 42.

One end 43 of the pivot lever 40 is rotatably supported on one end of an ejection slide member 44 by a rotation shaft 46 in order to cause the pivot lever 40 to pivot about the rotation shaft 42. The slide member 44 slides in a guide 48, integrally formed on one side wall 26, along the Y direction.

A tongue 50 is integrally formed on the other end of the pivot lever 40. The tongue 50 slidably contacts the inner side of a belt-shaped slide guide 5 slightly projecting from the surface of the housing plate 28. The slide guide 52 is formed by, e.g., punching the housing plate 28.

Therefore, when the slide member 44 is manually moved to slide in the Y direction, the pivot lever 40 pivots about the rotation shaft 42 along the upper surface of the housing plate 28.

Furthermore, a claw 54 projecting from the housing plate 28 side is formed on the pivot lever 40 by, e.g., punching.

The slide plate 56 is used to pull out the memory card 2 electrically connected to the connector section 24 of the connector device 1 from the connector section 24 when the memory card 2 is not in use. The slide plate 56 has a raised claw 58 at its proximal end. The claw 58 is engageable with the claw 54 of the pivot lever 40 along with the pivotal movement of the pivot lever 40. Therefore, when the pivot lever 40 is pivoted, the slide plate 56 slides in the Y direction on the surface of the housing plate 28. During this sliding, arms 60 and 62 and cutouts 68 and 70 (to be described later) serve as slide guides and regulate the X-direction movement of the slide plate 56.

The arms 60 and 62 are formed at two side end portions of the slide plate 56 to extend toward the connector section 24. Bent portions 64 and 66 are respectively formed on the arms 60 and 62. The bent portions 64 and 66 constitute steps with respect to the slide plate 56 such that they project toward the inner surface of the housing plate 28 via the cutouts 6 and 70 formed at two sides of the housing plate 28 on the connector section 24 side. Furthermore, the distal ends of the arms 60 and 62 are bent to form ejection hooks 72 and 74 engaged with the socket side end face of the memory card 2.

The memory card 2 must be electrically shielded. Therefore, if the housing plate 28 is made of a dielectric material such as stainless steel, a gap must be provided between the inner surface of the housing plate 28 and an opposing surface of the inserted memory card 2. For this purpose, projections 76 may be formed, for example, at three central portions of the slide plate 56 by extrusion molding. The projections 76 project into the storage space through holes 78 formed at corresponding positions of the housing plate 28 and can contact the outer surface of the inserted memory card 2. By these projections 76, the outer surface of the memory card 2 opposing the inner surface of the housing plate 28 is urged in a direction to separate from the inner surface of the housing plate 28.

Figure 7:
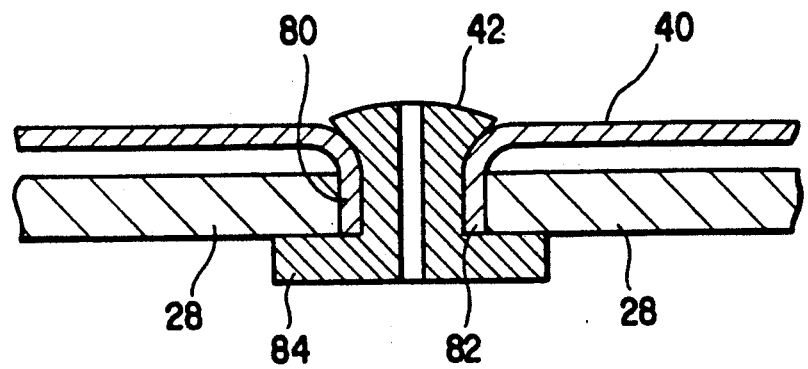
FIG. 7 is a sectional view showing a fulcrum portion of the ejection lever of the ejection mechanism shown in FIGS. 5 and 6.

FIG. 7 shows the section of the fulcrum portion of the pivot lever 40.

A cylindrical projection 80 formed on one portion of the pivot lever 40 is engaged with a bearing hole 82 formed in the housing plate 28. The rotation shaft 42 made of, e.g., brass is inserted in the cylindrical projection 80. The rotation shaft 42 has a through hole at its central portion. A flange 84 is formed on one end of the rotation shaft 42. The other end of the rotation shaft 42 is caulked to prevent the rotation shaft 42 from being slipped off. Accordingly, the rotation shaft 42 pivots within the bearing hole 82 in accordance with the pivotal movement of the pivot lever 40. As a result, the rotation shaft 42 is repeatedly pivoted while the inner circumferential surface of the bearing hole 82 of the housing plate 28 contacts the outer circumferential surface of the cylindrical projection 80 of the pivot lever 40 made of the same material. Since both the rotation shaft 42 and the cylindrical projection 80 have a high wear resistance, the durability of this fulcrum portion is remarkably improved.

The structure of the lower ejection mechanism 5 is basically the same as that of the upper ejection mechanism 3 except the following point. That is, a locking mechanism 87 that pivots toward the insertion port 33 about a rotation shaft 85 as the fulcrum is provided to the distal end of a slide member 44 of this lower ejection mechanism 5. When the HDD package 4 is received in the housing 22, the locking mechanism 87 locks the HDD package 4 in order to prevent loose connection between the sockets 4a of the HDD package 4 and the pin contact arrays 32. The locking mechanism 87 is normally located at a rotational position indicated by a solid line in FIG. 1. When the HDD package 4 is received in the housing 22, it is manually pivoted to a position indicated by a broken line. The HDD package 4 is locked in this manner.

In the connector device 1 having the above structure, when the memory card 2 is connected to or disconnected from the computer device, the upper and/or lower ejection mechanism 3 or 5 is used. First, to connect the memory card 2 to the computer device, the memory card 2 is inserted in the upper and/or lower storage space 22a and/or 22b through the insertion port 33 of the connector device 1, and the sockets 2a of the memory card 2 are engaged with the first upper pin contact array 34 of the connector section 24. In this case, the forward end face of the memory card 2 is engaged with the ejection hooks 72 and 74 of the slide plate 56 and the slide plate 56 is moved forward. Then, the pivot lever 40 is also pivoted about the rotation shaft 42. As a result, the slide member 44 projects from the end face of the housing 22 on the insertion port 33 side.

To disconnect the memory card 2, the slide member 44 is urged to pivot the pivot lever 40 about the rotation shaft 42. Then, the claws 54 and 58 are engaged with each other, the slide plate 56 is thus moved in the Y direction along the upper surface of the housing plate 28, and the memory card 2 is pulled out from the connector section 24 by the ejection hooks 72 and 74.

The upper and lower ejection mechanisms 3 and 5 can be operated independently of each other. Therefore, when two memory cards 2 are simultaneously loaded in the connector device 1, they can be connected to or disconnected from the computer device independently of each other. For example, while information is being loaded in the computer device from one memory card 2, the other memory card 2 can be disconnected from the computer device.

When the HDD package 4 is connected to or disconnected from the computer device, only the lower ejection mechanism 5 is used, and the ejection hooks 72 and 74 of the lower ejection mechanism 5 are engaged with the socket 4a side end face of the HDD package 4. The sockets 4a of the HDD package 4 are engaged with either upper or lower pin contact array, e.g., with the lower pin contact array 32 in the example shown in the drawings. Then, the HDD package 4 can be connected to or disconnected from the computer device in the same manner as the memory card 2.

In this manner, when the ejection mechanisms 3 and 5 are provided to the connector device 1, the memory card 2 or HDD package 4 can be connected to or disconnected from the computer device easily.

In the ejection mechanism 3 or 5 described above, the slide plate 56 slides on the surface of the housing plate 28 or 30. Therefore, if, e.g., the housing plate 28 is made of a metal and the edges of its though holes 78 are roughly finished, the contact surfaces of the edges and the slide plate 56 might be scraped by the slidable movement of the slide plate 56. When the metal scrapings attach to the memory card 2, the HDD package 4, or the connector section 24, electrical faults may occur. In order to prevent this, it is preferable to apply a plate-like cover 79 made of, e.g., polyethylene on a corresponding portion of the inner surface of the slide plate 56 that moves over the through hole 78.

In this embodiment, the storage space of the housing 22 is vertically divided by two. Therefore, the number of information storage devices that can be housed in the housing 22 is a maximum of 2 when the memory cards 2 are used and is a maximum of one when the HDD package 4 is used. However, the present invention is not limited to this. When the height of the housing 22 is increased, larger number of memory cards 2 and/or HDD packages 4 can be housed. Alternatively, in addition to the storage spaces serving for both the memory card 2 and the HDD package 4, a storage space for the memory card 2 and/or a storage space for the HDD package 4 can be provided.

The storage space for one HDD package 4 does not necessarily include a storage space for housing two memory cards 2 but can include a storage space for housing only one memory card 2.

Figure 8:
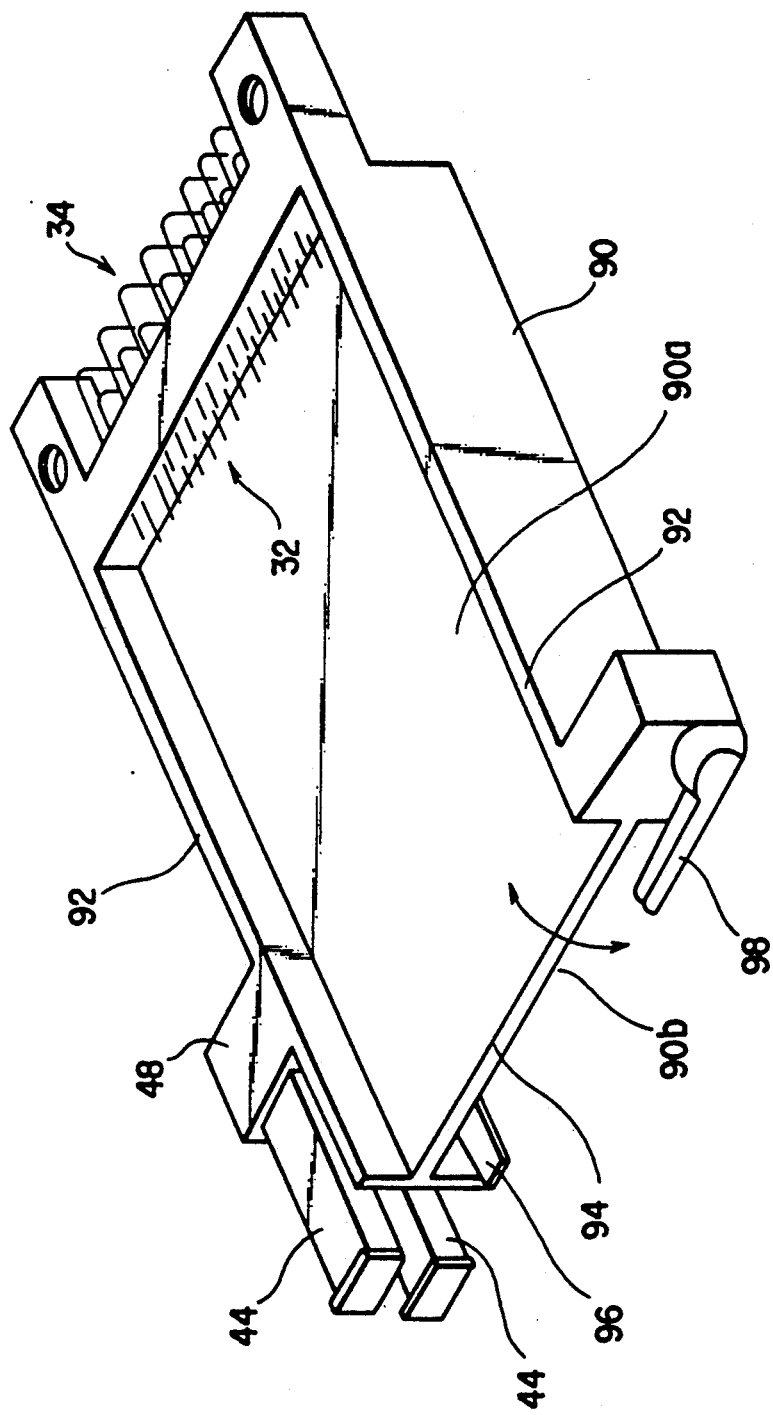
FIG. 8 is a perspective view showing a connector device according to the second embodiment of the present invention.

FIG. 8 shows the second embodiment of the present invention. A connector device 1' of this embodiment can use the memory card 2 (FIG. 3) and/or the HDD package 4 (FIG. 4) as an information storage device.

The connector device 1' is obtained by coupling a connector section 24' to a housing 90. Although the connector section 24' has a pair of upper and lower pin contact arrays 32 and a pair of upper and lower pin contact arrays 34, in the same manner as the connector section 24 of the first embodiment, FIG. 8 shows only the upper pin contact arrays 32 and 34.

The housing 90 has a pair of frames 92 defining its two sides and a plate-like separator 94 partitioning the storage space of the housing 90 into upper and lower storage spaces 90a and 90b. An open end portion of the housing 90 opposite the connector section 24' defines an insertion port.

With this connector device 1', one memory card 2 or one HDD package 4 can be housed in either the upper or lower storage space 90a or 90b, and at least one memory card 2 or one HDD package 4 can be selectively connected to the computer device. When the memory card 2 is to be housed in the lower storage space 90b, guide plates 96 for guiding the memory card 2 in the Y direction may be mounted on inner walls of the lower ends of the pair of frames 92, respectively. The guide plates 96 are detachably mounted on the frames 92 according to a known method.

The connector device 1' having this structure may have a pair of ejection mechanisms having the same structure as that of the ejection mechanism 3 of the first embodiment. In this case, the pair of ejection mechanisms are provided to the upper and lower surfaces of the separator 94 so that they oppose each other at their upper surface sides, i.e., the slide plate sides. In FIG. 8, members of the pair of ejection mechanisms except for slide members 44 and a guide 48 are not illustrated. When the pair of ejection mechanisms are operated independently of each other, even when the information storage device of either the upper or lower storage space 90a or 90b is in use, the other information storage device can be easily pulled out from the connector section 24'.

The locking mechanism for locking the HDD package 4 is formed as a lever 98 pivotally supported on the forward end face of one frame 92. The function of the lever 98 is similar to that of the locking mechanism 87 of the first embodiment. In the embodiment shown in FIG. 8, the lever 98 is provided in only the lower storage space 90b. However, it can also be provided in the upper storage space 90a.

According to the second embodiment, the number of combinations of maximum information storage devices that can be housed in the connector device 1' is three including combination of two memory cards 2, a combination of two HDD packages 4, and a combination of one memory card 2 and one HDD package 4. However, the present invention is not limited to this, and a larger number of memory cards 2 and/or HDD packages 4 can be housed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A connector device for selectively connecting at least one of a memory card and a hard disk drive package as a data storage device, comprising:

a housing having a pair of opposing side walls defining a storage space of said housing, one end of said housing defining an insertion port for inserting said at least one data storage device into at least a portion of the storage space of said housing;

a shallow guide member longitudinally extending along the inner side of at least one of the side walls of said housing to define at lest upper and lower storage spaces within the storage space of said housing, the storage spaces of said housing being substantially uninterrupted by said shallow guide member; and a connector section coupled to the end of said housing opposite the insertion port, said connector section having upper and lower contact arrays disposed respectively in the upper and lower storage spaces of said housing for connecting with storage devices inserted in the respective storage spaces, at least one of said upper and lower contact arrays being adapted to interchangeably connect to both a memory card and a hard disk drive package, whereby said connector device is capable of accepting a memory card in each of the upper and lower storage spaces, or alternatively, a hard disk drive package that may occupy both storage spaces.

2. A connector device as recited in claim 1 wherein the storage space of said housing has a height $H_1$ and wherein the upper and lower storage spaces defined within the storage space of said housing by said guide member each have a height $H_3$, the height $H_1$ of the storage space of said housing being substantially equal to a height $H_2$ of said at least one hard disk drive package, the height $H_3$ of each of the upper and lower storage spaces being substantially equal to a height of said at least one memory card.

3. A connector device according to claim 1 wherein the upper and lower contact arrays each have a first contact portion extending from said connector section into the respective upper and lower storage spaces for connecting to storage devices inserted in the respective storage spaces, and a second contact portion extending from said connector section external to said housing for connection to external electronic equipment.

4. A connector device according to claim 3 wherein the first contact portion of each contact array comprises a two pin contact array, and wherein the second contact portion of each contact array comprises a four pin array.

5. A device according to claim 3 wherein the external electronic equipment comprises one of a personal computer, a laptop computer and a notebook computer.

6. A connector device according to claim 1 wherein said shallow guide member is integrally formed with said at least one side wall.

7. A connector device according to claim 1, further comprising a locking member pivotally mounted on said housing proximate the insertion port, said locking member being operable to at least partially obstruct the insertion port when a hard disk drive package is connected to one of said contact arrays to prevent the hard disk drive from inadvertently being disconnected from said one contact array.

8. A connector device according to claim 1, further comprising:
- a slide plate disposed proximate one of said upper and lower storage spaces and being operable to slide toward and away from said connector section in a plane parallel to the plane defined by said opposing side walls, said side plate having ejection hooks that extend into said one storage space to engage with a forward end face of a storage device connected to the contact array disposed in said one storage space;
- an ejection member slidably mounted on the outer side of one of the side walls of said housing and being operative to slide lengthwise of said housing toward and away from said connector section; and
- a pivot lever rotatably mounted on said housing and arranged to rotate in a plane parallel to the plane of said slide plate, one end of said pivot lever being coupled to said slide plate and the other end of said pivot lever being coupled to said ejection member.

9. A connector device according to claim 8 further comprising:
- a second slide plate disposed proximate the other of said upper and lower storage spaces and being operable to slide toward and away from said connector section in another plane parallel to the plane defined by said opposing side walls, said second slide plate having ejection hooks that extend into said other storage space to engage with a forward end face of a storage device connected to the contact array disposed in said other storage space;
- a second ejection member slidably mounted on the outer side of the other side wall of said housing and being operative to slide lengthwise of said housing toward and away from said connector section; and
- a second pivot lever rotatably mounted on said housing and arranged to rotate in a plane parallel to the plane of said second slide plate, one end of said second pivot lever being coupled to said second slide plate and the other end of said second pivot lever being coupled to said second ejection member.

10. A connector device for selectively connecting at lest one of a memory card and a hard disk drive package as a data storage device, comprising:
- a housing having upper and lower housing plates and a pair of opposing side walls defining a storage space of said housing, one end of said housing being open and defining an insertion port for inserting said at least one data storage device into at least a portion of the storage space of said housing;
- a shallow guide member longitudinally extending along the inner side of at least one of the side walls of said housing to define at least upper and lower storage spaces within the storage space of said housing, the storage space of said housing being substantially uninterrupted by said shallow guide member; and
- a connector section coupled to the end of said housing opposite the insertion port, said connector section having upper and lower contact arrays disposed respectively in the upper and lower storage spaces of said housing for connecting with storage devices inserted in the respective storage spaces, at least one of said upper and lower contact arrays being adapted to interchangeably connect to both a memory card and a hard disk drive package, whereby said connector device is capable of accepting a memory card in each of the upper and lower storage spaces, or alternatively, a hard disk drive package that may occupy both storage spaces.

11. A connector device as recited in claim 10 wherein the storage space of said housing has a height $H_1$ and wherein the upper and lower storage spaces defined within the storage space of said housing by said guide member each have a height $H_3$, the height $H_1$ of the storage space of said housing being substantially equal to a height $H_2$ of said at least one hard disk drive package, the height $H_3$ of each of the upper and lower storage spaces being substantially equal to a height of said at least one memory card.

12. A connector device according to claim 10 wherein the upper and lower contact arrays each have a first contact portion extending from said connector section into the respective upper and lower storage spaces for connecting to storage devices inserted in the respective storage spaces, and a second contact portion extending from said connector section external to said housing for connecting to external electronic equipment.

13. A connector device according to claim 12 wherein the first contact portion of each contact array comprises a two pin contact array, and wherein the second contact portion of each contact array comprises a four pin array.

14. A device according to claim 12 wherein the external electronic equipment comprises one of a personal computer a laptop computer and a notebook computer.

15. A connector device according to claim 10 wherein said shallow guide member is integrally formed with said at lest one side wall.

16. A connector device according to claim 10, wherein comprising a locking member pivotally mounted on said housing proximate the insertion port, said locking member being operable to at lest partially obstruct the insertion port when a hard disk drive package is connected to one of said contact arrays to prevent the hard disk drive from inadvertently being disconnected from said one contact array.

17. A connector device according to claim 10 wherein the upper and lower housing plates of said housing each have cutouts formed therein at predetermined locations, and wherein said connector device further comprises:
- a slide plate coupled to and slidable over the outer surface of one of the hosing plates and having ejection hooks that extend through the cutouts in said one housing plate to engage with a forward end face of a storage device connected to he contact array closest to said one housing plate;
- an ejection member slidably mounted on the outer side of one of the side walls of said housing and being operative to slide lengthwise of said housing toward and away from said connector section; and a pivot lever rotatably mounted on said one housing plate, one end of said pivot lever being coupled to said slide plate and the other end of said pivot lever being coupled to said ejection member.

18. A connector device according to claim 19 further comprising:

a second slide plate coupled to and slidable over the outer surface of the other housing plate and having ejection hooks that extend through the cutouts in said other housing plate to engage with a forward end face of a storage device connected to the contact array closest to said other housing plate;

a second ejection member slidably mounted on the outer side of the other side wall of said housing and being operative to slide lengthwise of said housing toward and away from said connector section; and a second pivot lever rotatably mounted on said other housing plate, one end of said second pivot lever being coupled to said second slide plate and the other end of said second pivot lever being coupled to said second ejection member.

19. A connector device according to claim 10 wherein the upper and lower housing plates have cutouts formed therein at predetermined locations, and wherein said connector device further comprises:

a slide plate coupled to and slidable over the outer surface of the upper housing plate and having ejection hooks that extend through the cutouts in the upper housing plate into the upper storage space to engage with a forward end face of a storage device connected to the upper contact array;

an ejection member slidably mounted on the outer surface of one of the side walls of said housing and being operable to slide lengthwise of said housing toward and away from said connector section; and a pivot lever rotatably mounted on the upper housing plate, one end of said pivot lever being coupled to said slide plate and the other end of said pivot lever being coupled to said ejection member.

20. A connector device according to claim 19 further comprising:

a second slide plate coupled to and slidable over the outer surface of the lower housing plate and having ejection hooks that extend through the cutouts in the lower housing plate into the lower storage area to engage with a forward end face of a storage device connected to the lower contact array;

a second ejection member slidably mounted on the outer surface of the other side wall of said housing and being operable to slide lengthwise of said housing toward and away from said connector section; and a second pivot lever rotatably mounted on the lower housing plate, one end of said second pivot lever being coupled to said second slide plate and the other end of said second pivot lever being coupled to said second ejection member.

* * * * *